(12) United States Patent
Gonthier et al.

(10) Patent No.: US 6,542,022 B2
(45) Date of Patent: Apr. 1, 2003

(54) VOLTAGE PULSE ANALOG GENERATOR

(75) Inventors: Laurent Gonthier, Tours (FR); Mickael Destouches, Serriere Larcon (FR); Jean Jalade, Castanet-Tolosan (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/742,898

(22) Filed: Dec. 20, 2000

(65) Prior Publication Data

US 2001/0043111 A1 Nov. 22, 2001

(30) Foreign Application Priority Data

Dec. 24, 1999 (FR) ............................. 99 16491

(51) Int. Cl.$^7$ ........................................... H03K 17/725
(52) U.S. Cl. ................... 327/460; 327/453; 327/447
(58) Field of Search .............................. 327/445, 447, 327/453, 460, 465, 455, 457, 469

(56) References Cited

U.S. PATENT DOCUMENTS

| | | | | |
|---|---|---|---|---|
| 3,585,403 A | * | 6/1971 | Gribbons ................... | 315/340 |
| 3,611,211 A | * | 10/1971 | Theodore ................... | 307/106 |
| 3,652,875 A | | 3/1972 | Kukucka et al. ........ | 307/252 M |
| 3,764,832 A | * | 10/1973 | Stettner ................... | 327/392 |
| 3,950,693 A | * | 4/1976 | Mitsuoka .................. | 327/460 |
| 3,955,104 A | * | 5/1976 | Dumas ...................... | 327/438 |
| 5,148,049 A | | 9/1992 | Okutsu et al. ........... | 307/270 |
| 5,349,212 A | | 9/1994 | Seki ........................ | 257/133 |
| 5,798,914 A | * | 8/1998 | Wuidart et al. .......... | 363/39 |
| 5,861,639 A | * | 1/1999 | Bernier .................... | 257/112 |
| 6,046,916 A | * | 4/2000 | Wuidart et al. .......... | 323/267 |

FOREIGN PATENT DOCUMENTS

| WO | WO 99/20082 | 4/1999 | ........... H05B/39/02 |
|---|---|---|---|

* cited by examiner

Primary Examiner—Terry D. Cunningham
(74) Attorney, Agent, or Firm—Wolf, Greenfield & Sacks, P.C.; James H. Morris; Gary S. Engelson (57) ABSTRACT

An analog voltage pulse generator, including a first breakover component of Shockley diode type to activate a rising edge of a pulse on an output terminal and a second component of thyristor type to block the first component and deactivate the pulse.

40 Claims, 3 Drawing Sheets

VOLTAGE PULSE ANALOG GENERATOR

BACKGROUND OF THE INVENTION

1. Field of the Invention

The present invention relates to the pulse control (repetitive or single-shot) of one or several MOS-type switches or the like. The present invention more specifically relates to a voltage pulse generator to control such switches. In the present description, a "MOS switch or the like" designates any switch to be controlled by a voltage level such as, for example, MOS transistors or IGBTs. The present invention more specifically relates to the control of such switches used in the field of power regulation to control the operation of industrial or household equipment. In such a field, power semiconductor components switched to effect a so-called conduction angle control (or phase control) in which a power switch is only turned on for a portion of the duration of each halfwave or of one halfwave out of two of the supply voltage are often used. Such systems are currently used in the field of domestic lighting to form light dimmers, and in many other applications to provide power controllers.

2. Discussion of the Related Art

Power regulation by conduction angle control has the well-known disadvantage of generating, on the mains, harmonics due to the fact that the switch (for example, a triac) is turned on when a relatively high voltage is present thereacross. The harmonics cause electromagnetic disturbances and are a major problem. Various standards have been developed to require the manufacturer to avoid generating such disturbances. A simple way of avoiding the reinjection of harmonics on the mains consists of filtering them out. However, adding a passive filter to a controller is a serious handicap in terms of bulk, weight, and cost. To avoid this filter, it has also been envisaged to basically tackle the problem, by controlling the current variation speed (di/dt) upon switchings. Unfortunately, neither thyristors, nor triacs—which are ideal components for fabricating a variator due to their robustness, to their immunity against overcharges, to their switching ease and to their low on-state dissipated power—allow control of di/dt.

Figure 1:
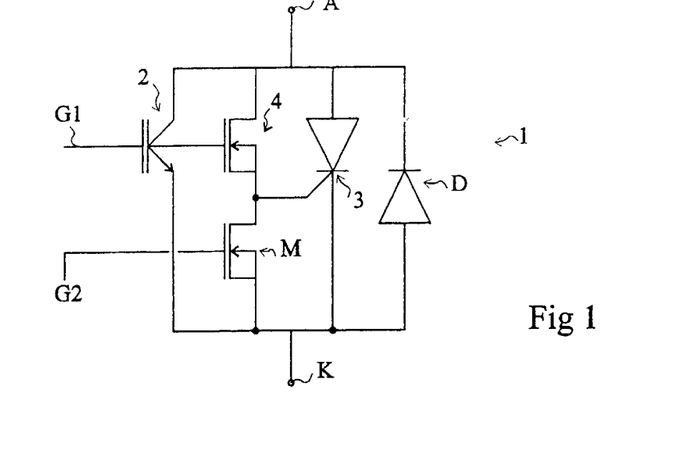
FIG. 1 shows an embodiment of a power switch with a controlled di/dt of the type to which the present invention preferentially applies.

FIG. 1 shows an example of a power switch with a controlled di/dt of the type to which the present invention more specifically applies. Such a circuit, preferably monolithic, includes two power components A and K and two control terminals G1 and G2. Switch 1 includes the parallel assembly of a MOS or IGBT-type component 2 and of a thyristor-type component 3, and means for inhibiting the thyristor-type component during a turn-on phase of the switch that is ensured by the IGBT-type component 2. IGBT power transistor 2 and power thyristor 3 are connected in parallel between terminals A and K. The anode of thyristor 3 and the collector of IGBT 2 are connected to anode A. The cathode of thyristor 3 and the IGBT emitter are connected to cathode K. In the embodiment of FIG. 1, a diode D is connected in antiparallel to thyristor 3 between terminals A and K. IGBT 2 is connected to a first control terminal G1 by its gate. The control of thyristor 3 is ensured by a high-voltage MOS transistor 4 (or by a second IGBT) connected between the anode of thyristor 3 and its gate. The source of high-voltage transistor 4 is connected to cathode K via a low-voltage MOS transistor M, the gate of which is connected to a second control terminal G2. The gate of transistor 4 is, preferably, connected to terminal G1. Alternatively, an impedance may be provided between the gates of transistors 2 and 4, or individualized signals may be provided for each of transistors 2, 4, and M.

Switch 1 of FIG. 1 is a one-way component. Thus, two switches of this type must be used in series-opposition to obtain a fullwave power controller. For example, the terminal A of a first switch 1 such as shown in FIG. 1 is connected to a first terminal of a load to be supplied, the other terminal of which is connected to a first mains voltage application terminal. The other mains voltage application terminal is then connected to the terminal A of a second switch 1, the terminal K of which is connected to terminal K of the first switch.

Figure 2A:
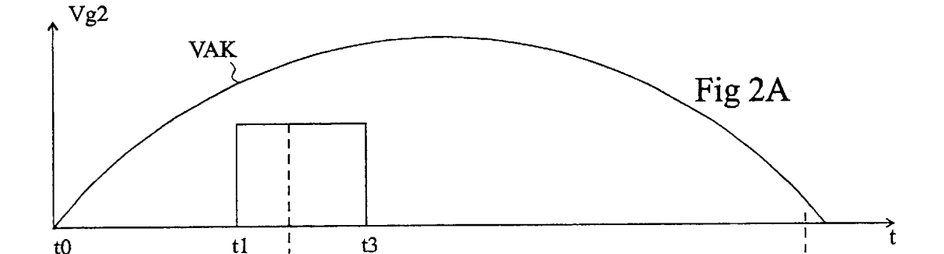
FIGS. 2A, 2B and 2C illustrate, in the form of timing diagrams, the operation of a power switch such as shown in FIG. 1.
Figure 2B:
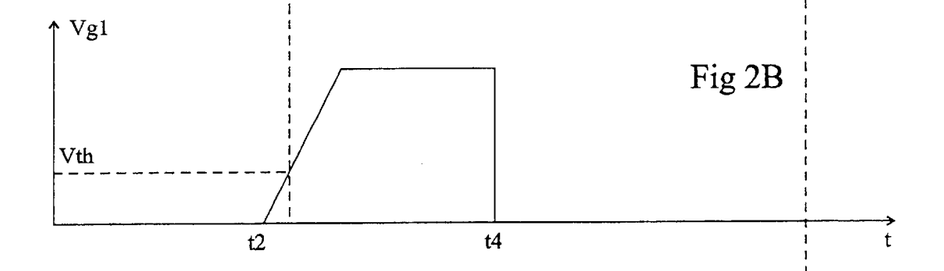
Figure 2C:
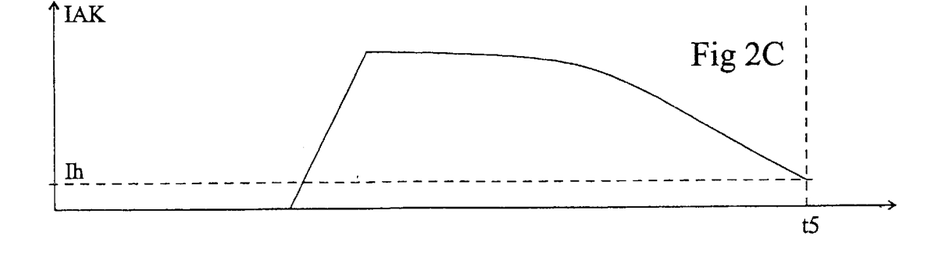

The operation of the circuit of FIG. 1 will be explained in relation with FIGS. 2A to 2C that respectively show, in the form of timing diagrams, voltage $V_{g2}$ on gate G2, voltage $V_{g1}$ on gate G1, and current $I_{AK}$ between anode A and cathode K of switch 1 of FIG. 1. A positive halfvave of voltage $V_{AK}$ between terminals A and K is considered. At a time t1, included in the first half of a halfwave of the mains voltage according to the desired conduction angle, gate G2 of transistor M is controlled to turn on transistor M, so that the gate and the cathode of thyristor 3 are short-circuited and that this thyristor cannot be turned on. At a time t2, subsequent to time t1 and also chosen according to the desired conduction angle, a voltage ramp having its slope controlled to obtain the desired di/dt is applied to gate G1 of IGBT 2. This ramp results for example from the application of a square or pulse signal through a fixed or variable impedance (of low power since it is a control signal), for example, a resistor or an RC filter. As soon as the voltage on terminal G1 exceeds a threshold value $V_{th}$, current $I_{AK}$ starts progressively increasing to reach a value depending on the mains voltage and on the impedance of the load at this time. Then, at a time t3, the signal on gate G2 is cut off to turn off transistor M. Since transistor 4 has been turned on by the ramp applied on gate G1 and on its own gate, the current flowing through transistor 4 triggers thyristor 3. Thyristor 3 turns on and its conduction is predominant over that of IGBT 2 since, generally, a thyristor exhibits a lower voltage drop than a MOS or IGBT power transistor. Then, at a time t4, the signal on gate G1 is cut off, so that IGBT 2 and transistor 4 definitively turn off. Thus, towards the end of the halfwave, at a time t5, current $I_{AK}$ falls under a hold value Ih and the thyristor turns off. Gate voltage G1 has been interrupted to prevent IGBT 2 turning on again.

Each of the IGBT 2 and the transistor 4 can be replaced by an IGBT or MOS or bipolar power transistor. Other monolithic power switch circuits with a controlled di/dt of the type to which the present invention applies are described in U.S. patent application Ser. No. 09/467,357 assigned to the present assignee, that is incorporated by reference.

As appears from the description of the operation of the power switch of FIG. 1, said switch must be controlled by two voltage pulses upon each halfwave of the A.C. voltage. Additionally, the pulse for controlling transistor M must have a control. The provision of such pulses results in several constraints. A first constraint is that said pulses are voltage pulses while it is more frequent, in the field of power variation, to control components (for example, triacs) with current pulses. A second constraint is that it is here necessary to control two switches (IGBT 2 and transistor M) while in conventional triac-based power variation circuits, a single gate is controlled. A third constraint as compared to circuits using triacs is that the control voltage must have a given polarity.

Of course, the solution that comes to mind to implement the control of such a power switch is to use a digital circuit (for example, based on a microprocessor) to generate, in a perfectly controlled way, the desired voltage pulses.

However, such a solution has the disadvantage of being particularly expensive and of requiring an auxiliary power supply for a digital component.

SUMMARY OF THE INVENTION

An object of the present invention is to provide a voltage pulse generator that respects the previously-indicated constraints and that overcomes the disadvantages of a digital solution.

Another object of the present invention is to provide a pulse generation circuit, most components of which are integrable.

Another object of the present invention is to provide a particularly simple solution, of low bulk.

More generally, the present invention aims at providing a voltage pulse generator for controlling a power switch of IGBT or MOS type.

To achieve these and other objects, the present invention provides an analog voltage pulse generator, including a first break-over component of Shockley diode type to activate a rising edge of a pulse on an output terminal; and a second component of thyristor type to block the first component and deactivate the pulse.

According to an embodiment of the present invention, the pulse generator includes an RC cell between an input terminal and said first component to preset the time of occurrence of a rising edge of a pulse.

According to an embodiment of the present invention, the pulse generator includes a first resistor between said first component and said generator output terminal.

According to an embodiment of the present invention, the pulse generator includes a second resistor in parallel with the second component.

According to an embodiment of the present invention, the first component is formed of a first element of thyristor type associated with a second element of Zener diode type between its gate and its anode.

According to an embodiment of the present invention, the second component is a cathode-gate thyristor, the anode of which is connected to the cathode of the first component and the gate of which is connected, via a Zener diode, to a terminal of a capacitor adapted to being charged when the first component is on.

According to an embodiment of the present invention, the second component is an anode-gate thyristor adapted to being connected to an input of turn-on detection, by the rising edge of a pulse, of a MOS or IGBT-type component.

According to an embodiment of the present invention, a diode is interposed between the anode gate of the second component and the measurement terminal, a Zener diode being preferably interposed between the anode gate of the second thyristor-type component and the measurement terminal.

The present invention also provides a circuit for controlling a load adapted to being supplied by a high A.C. voltage including at least one power switch with a controlled di/dt including the parallel assembly of a MOS or IGBT-type components and of a thyristor-type component, with means for inhibiting the thyristor-type component during the turn-on phase of the switch, which is ensured by the IGBT-type component; and at least one voltage pulse generator of the above type for controlling with pulses the turing-on of the IGBT-type component.

According to an embodiment of the present invention, the means for inhibiting the component of thyristor type of the power switch is formed of a MOS-type transistor, the gate of which is also controlled with pulses, by means of said voltage pulse generator.

According to an embodiment of the present invention, the circuit includes two power switches, connected in series-opposition with each other and in series with the load to be controlled, each switch being associated with a sign of halfwaves of the A.C. voltage and being controlled by a pulse generator, the time of occurrence of a rising edge of a pulse with respect to the beginning of a halfwave of the A.C. voltage being set by means of a resistive element common to both generators and assembled in series with two storage capacitors respectively dedicated to one of the generators.

According to an embodiment of the present invention, the circuit includes two power switches, connected in series-opposition with each other and in series with the load to be supplied, each switch being associated with a sign of halfwaves of the A.C. voltage and the two switches being controlled by the same pulse generator associated with a rectifying means, the time of occurrence of a rising edge of a pulse with respect to the beginning of a halfwave of the A.C. voltage being set by means of a resistive element in series with a storage capacitor.

The foregoing objects, features and advantages of the present invention will be discussed in detail in the following non-limiting description of specific embodiments in connection with the accompanying drawings.

DETAILED DESCRIPTION

The same elements have been designated with the same references in the different drawings. For clarity, only those elements which are necessary to the understanding of the present invention have been shown in the drawings and will be described hereafter. In particular, the load to be controlled by the power switch with a controlled di/dt to which the present invention applies has not been detailed. It should be noted that the present invention more specifically applies to cases in which the load supply power is to be varied.

A feature of the present invention is to provide an analog circuit for generating voltage pulses by use of a break-over component of Shockley diode type and of a thyristor type component. A first break-over component or the like is used to activate the pulse, that is, to establish its rising edge, and a second component of thyristor type or the like is used to deactivate the pulse, that is, to generate its falling edge by annulling the current in the first component.

Figure 3:
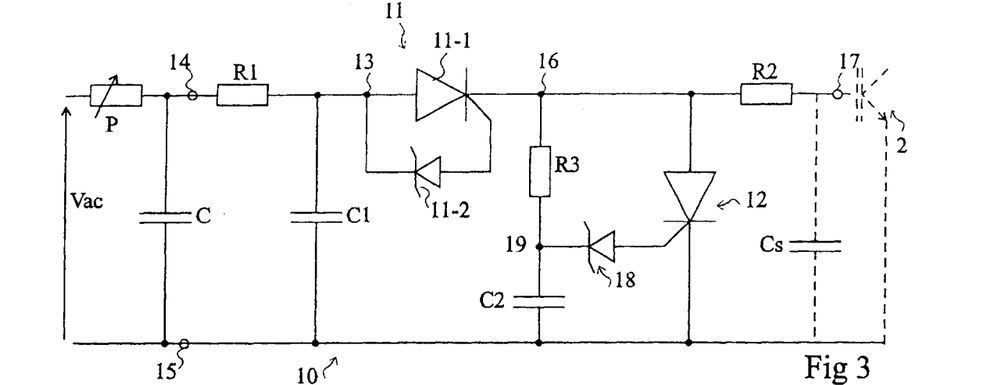
FIG. 3 schematically shows a first embodiment of a voltage pulse generator according to the present invention.

FIG. 3 shows a first embodiment of a voltage pulse generator according to the present invention. This generator 10 includes a first component 11 of Shockley diode type or the like, the function of which is to be turned on to generate the rising edge of a pulse, and a second component 12 of thyristor type or the like, the function of which is to generate the falling edge of the pulse.

Component 11 is shown in the form of a thyristor 11-1 with a Zener diode 11-2 between its gate and its anode 13, the anode of diode 11-2 being connected to the gate of thyristor 11-1. Component 11 is turned on when the voltage thereacross exceeds a threshold (set by Zener diode 11-2) and exhibits, once on, a low voltage drop (that of thyristor 11-1). This component turns off as the current decrease to a (current lower than the hold current of thyristor 11-1).

Anode 13 of thyristor 11-1 (defining the anode of component 11) is connected, via a resistor R1, to a first input terminal 14 of the generator. Terminal 14 is intended for receiving a control voltage enabling determining the pulse characteristics. In the case of a circuit powered by an A.C. voltage (for example, the mains voltage), this control voltage determines the delay between the rising edge of the pulse and the beginning of the halfwave. The control voltage is applied between first terminal 14 and a second input terminal 15 forming the generator reference (for example, the ground). Resistor R1 forms, with a capacitor C1 connected between terminals 13 and 15, an input RC cell. Component 11 is turned on when the voltage across capacitor C1 becomes greater than the threshold voltage of Zener diode 11-2, considering that cathode 16 of thyristor 11-1 (defining the cathode of component 11) is at a zero potential in the idle state (corresponding to the reference potential 15). Cathode 16 of thyristor 11 is connected, via a resistor R2, to an output terminal 17 of the generator, intended for being connected to the gate of the IGBT or MOStype component to be controlled (IGBT 2 shown in dotted lines in FIG. 3). Thyristor 12 or the like, intended for deactivating the pulse, has its cathode connected to reference terminal 15.

In the embodiment of FIG. 3, thyristor 12 is a cathode-gate thyristor and has its anode connected to cathode 16 of thyristor 11-1. The gate of thyristor 12 is connected, by a Zener diode 18, to the midpoint 19 of a series connection of a resistor R3 with a capacitor C2 connected between terminals 16 and 15. The anode of Zener diode 18 is connected to the gate of thyristor 12 while its cathode is connected to node 19. Resistor R3 is used to create a delay between the charge and discharge times of the gate of the component to be controlled. A capacitor Cs may be provided between terminals 17 and 15. This capacitor then participates in the setting of the time constants as will be seen hereafter and has the advantage, in particular, of canceling the effects of possible technological dispersions in the IGBT manufacturing. Capacitor Cs may be made in integrated form in circuit 10.

The function of Zener diode 18 is to turn on thyristor 12 when the voltage stored by capacitor C2 becomes greater than the threshold voltage of diode 18. This voltage storage across capacitor C2 occurs while the pulse is active, that is, when thyristor 11-1 is on. The turning-on of thyristor 12 short-circuits terminals 16 and 15, which has several consequences. First, this discharges the gate of component 2 connected to terminal 17 and, if present, capacitor Cs, which deactivates the pulse. Further, this causes the discharge of capacitor C2 to set the circuit back to an idle position where capacitor C2 is discharged for a subsequent pulse. Further, thyristor 12 in the on-state is used to discharge input capacitor C1 through thyristor 11-1 that only turns-off when the current flowing therethrough becomes zero (more specifically, when it becomes lower than its hold current), that is, when capacitor C1 is discharged. Once thyristor 11-1 is off, thyristor 12 also turns off since it now only conducts a current lower than its hold current. For simplification, reference will sometimes be made to the absence of any current, which means that the currents are lower than the hold currents of thyristors 11-1 and 12.

The duration of the voltage pulse depends on the values of resistor R3, of capacitor C2, and of Zener diode 18. Further, only considering the components of generator 10, the turn-on delay of thyristor 11-1 with respect to the beginning of a charge cycle of capacitor C1 depends on the value of Zener diode 11-2 as well as the time constant of cell R1-C1 that can be considered as a presetting element. In practice, other components external to generator 10 will most often have an influence on this delay, as will be seen hereafter.

In the example shown in FIG. 3, it is assumed that pulse generator 10 is intended for being supplied by an A.C. voltage Vac, for example, the mains voltage. In such a case, to form a power controller, a potentiometer P is connected between a first voltage Vac application terminal and terminal 14, and a capacitor C is connected between terminals 14 and 15, terminal 15 forming the second voltage Vac application terminal. By means of such a connection, the turn-on time of thyristor 11-1, that is, the beginning of a voltage pulse with respect to the zero crossing of A.C. voltage Vac, is determined by the values of capacitors C and C1 and of resistor R1, as well as by the adjusted resistance of potentiometer P. It will be seen in relation with FIG. 6 that the load may, in some cases, be involved in the setting of the turn-on time.

The pulse generator 10 illustrated in FIG. 3 is operative for one sign only of the halfwaves of A.C. voltage Vac. This is however not disturbing since the component 2 of IGBT or MOS transistor type to be controlled by the pulse generator is itself a one-way component and since it is required to provide two circuits of the type of that shown in FIG. 1 to obtain a power controller operating with the positive and negative halfwaves of the A.C. supply voltage. Accordingly, two pulse generators 10 will also be provided according to the present invention. No structural modification is required for the circuit to operate with negative halfwaves. The supply voltage connection terminals must only be inverted.

Figure 4:
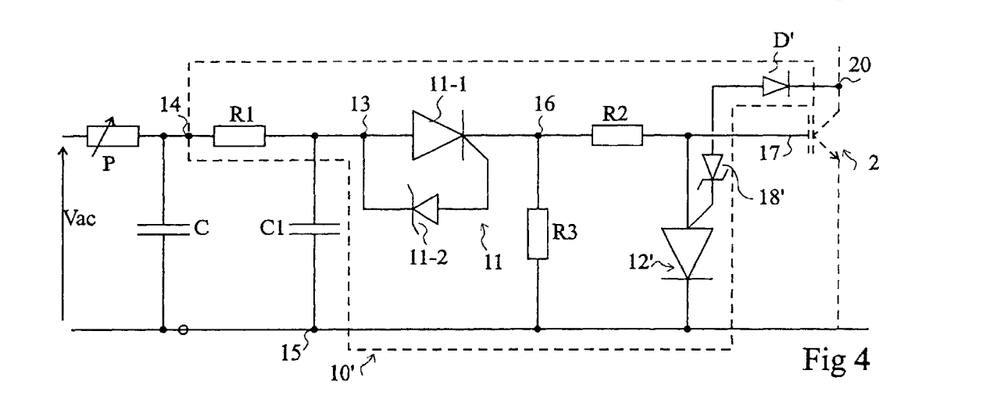
FIG. 4 schematically shows a second embodiment of a voltage pulse generator according to the present invention.

FIG. 4 shows a second embodiment of a voltage pulse generator 10' according to the present invention. Generator 10' includes the components of the generator of FIG. 3 as concerns the pulse activation, that is, the connections of component 11 (thyristor 11-1 and Zener diode 11-2), of resistor R1, and of capacitor C1. Similarly, cathode 16 of component 11 is connected, via resistor R2, to gate 17 of component 2 to be controlled. Capacitor Cs has not been shown in FIG. 4. It may however be present for the same reasons as those discussed in relation with FIG. 3.

In the embodiment of FIG. 4, the thyristor-type component, intended for turning off the pulse, is an anode-gate thyristor 12' connected between terminal 17 and terminal 15, the anode of thyristor 12' being connected to terminal 17. Thyristor 12' has, as previously, the function of bringing the gate of component 2 down to ground and of discharging capacitors C1, C, and if present, Cs, to turn thyristor 11-1 off. In this embodiment, the anode gate of thyristor 12' is connected, via a diode D', to an input measurement terminal 20 of the generator, intended for being connected to the anode of IGBT 2. The anode of diode D' is connected to the gate of thyristor 12'. Optionally, a Zener diode 18' connects the gate of thyristor 12' to the anode of diode D'. The function of diode 18' is to set the voltage drop across IGBT 2 from which it is decided to discharge its gate 17. A resistor R3, between terminals 16 and 15, ensures a permanent discharge of capacitors C1 and Cs after the control.

The operation of the circuit of FIG. 4 is similar to that discussed in relation with FIG. 3, with the difference that the pulse duration is no longer determined by a capacitor internal to the pulse generator but, externally, by a voltage measurement across the component that is controlled. Thus, the turn-off order for IGBT 2 is generated by the end of the triggering of the IGBT itself. It is thus no longer required to pre-program the pulse generator to determine the end of the pulse by means of a delay created by the charge of capacitor C2 (FIG. 2). When IGBT 2 turns off, a current flows through the anode gate of thyristor 12', which results in its triggering. If a Zener diode 18' is provided, it delays the triggering time of thyristor 12' with respect to the reduction of the current in IGBT 2. The function of diode D' is to protect the gate of thyristor 12' by preventing the anode current of controlled switch 1 (FIG. 1) from destroying thyristor 12'.

An advantage of the embodiment of FIG. 4, as compared to that of FIG. 3, is that, except for capacitor C1, all components of voltage pulse generator 10' are integrable whereas capacitor C2 of FIG. 3 is not easily integrable on silicon.

It should be noted that, in the embodiment of FIG. 3, it will be ascertained for the pulse duration that the falling edge is present at the end of the triggering of IGBT 2. In the embodiment of FIG. 4, this adaptation is performed automatically.

Figure 5A:
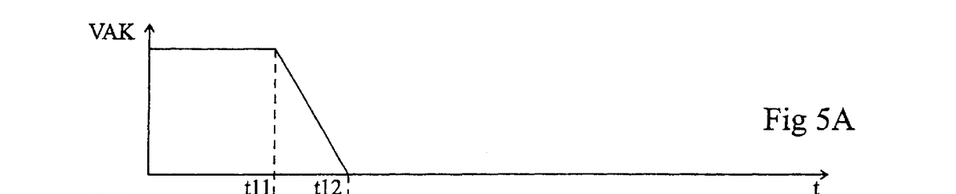
FIGS. 5A, 5B and 5C illustrate, in the form of timing diagrams, the operation of the generator of FIG. 4.
Figure 5B:
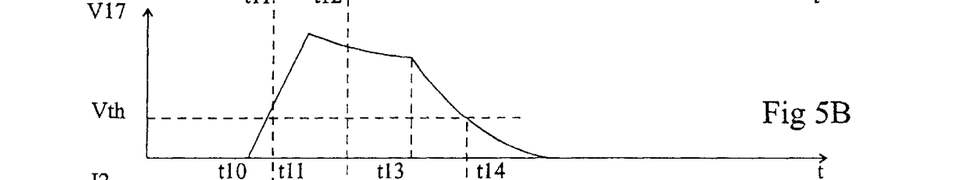
Figure 5C:
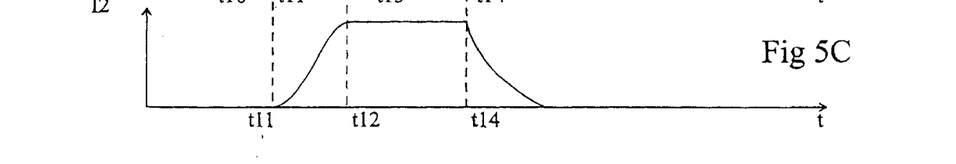

FIGS. 5A, 5B, and 5C illustrate the operation of voltage pulse generator 10' of FIG. 4 by showing, in the form of timing diagrams, an example of shapes of voltage $V_{AK}$ across component 2 to be controlled, of gate voltage V17 of component 2, and of current I2 flowing therethrough. It is assumed that at a time tl0, the voltage across capacitor C1 exceeds the threshold of Zener diode 11-2. This results in a turning-on of thyristor 11-1, which causes a rising edge of the voltage pulse on gate 17 of component 2. Under the effect of the application of a gate voltage, IGBT-type component 2 to be controlled turns on just after (time t11) its gate voltage has exceeded its conduction threshold $V_{th}$. Voltage $V_{AK}$ starts decreasing while current I2 flowing through this component increases to reach a nominal level at a time t12. Voltage V17 is slightly decreasing during this time, due to the discharge of capacitor C1 into resistor R3. At time t12 when component 2 is fully conductive, a current starts flowing from the anode gate of thyristor 12', which turns the latter on. In the example of FIGS. 5A to 5C, a slight delay has been illustrated, that is, a turning-on of thyristor 12' has been considered at a time t13 slightly subsequent to time t12 to take account of the presence of Zener diode 18'. From time t13 on, since thyristor 12' turns on, it discharges gate 17 of component 2 (FIG. 5B) as well as input capacitor C1 of the pulse generator. In the example of FIGS. 5A and 5C, it is assumed that current I2 disappears by the turning-off of the IGBT-type component while voltage $V_{AK}$ remains null since the example of the circuit of FIG. 1 is considered, in which thyristor 3 has turned on. Current I2 starts decreasing at a time t14 when voltage V17 has fallen back under threshold $V_{th}$.

Figure 6:
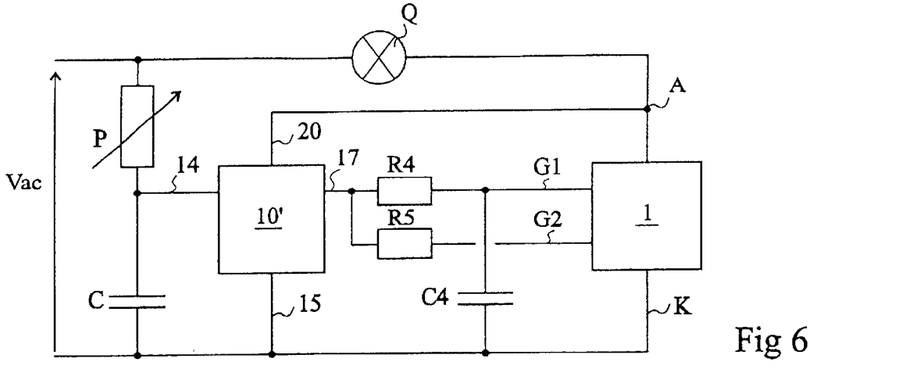
FIG. 6 schematically shows a first embodiment of a load control circuit implementing the present invention.

FIG. 6 schematically shows a first example of application of a voltage generator 10' of the present invention to the control of a power switch with a controlled di/dt of the type illustrated in FIG. 1. It is assumed that load Q (for example, a lamp), the power of which is desired to be varied by means of potentiometer P, is supplied only by one halfwave out of two of A.C. voltage Vac. As an alternative, the presence of a rectifying bridge upstream of potentiometer P may be considered, as well as the fact that the voltage applied across the series connection of potentiometer P with capacitor C is a rectified voltage, in which case lamp Q is supplied fullwave.

To ensure the control of a power switch 1 with a controlled di/dt and, more specifically, to determine the control slope of gate G1 of IGBT 2 (FIG. 1), an RC cell is provided between output terminal 17 of generator 10' and terminal G1. Accordingly, as illustrated in FIG. 6, a resistor R4 connects terminal 17 to gate G1, which is itself grounded (terminal 15 of generator 10' or cathode K of switch 1) via a capacitor C4. Gate G2 of MOS transistor M is in turn connected to output terminal 17 via a resistor R5. Indeed, it is here not required to provide a slope to the rising edge of the control pulse (time t1, FIG. 2A). By using a single voltage pulse generator, cell R4-C4 is used not only to provide a slope to the rising edge of the pulse controlling gate G1, but also to create the necessary delay between signals $V_{g1}$ and $V_{g2}$ (FIGS. 2B and 2A). The fact that the falling edge of the pulse occurs simultaneously on terminal 17 for the two gates is not disturbing due to the discharge of capacitor C4 that then delays the ending time (t4, FIG. 2B) of the pulse on gate G1 with respect to the ending time (t3, FIG. 2A) of the pulse on gate G2. It can thus be seen that the generator of the present invention is perfectly compatible with the use of a power switch with a controlled di/dt such as illustrated in FIG. 1.

As an alternative not shown of the assembly of FIG. 6, potentiometer P is connected between terminals 14 and A. In this case, load Q has an effect upon the characteristic operating durations of the assembly and in particular, upon the triggering delay of thyristor 11-1 (FIG. 3) with respect to the beginning of the positive halfwaves.

Figure 7:
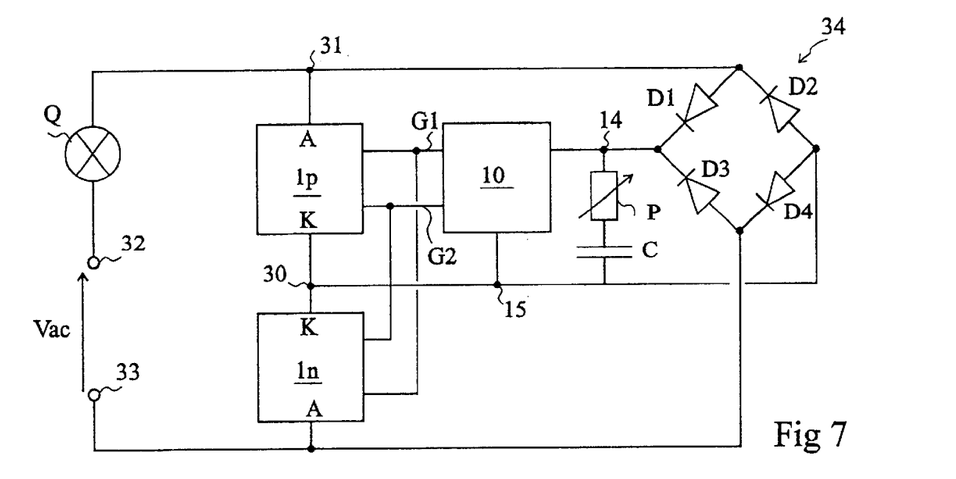
FIG. 7 schematically shows a second embodiment of a load control circuit implementing the present invention.
Figure 8:
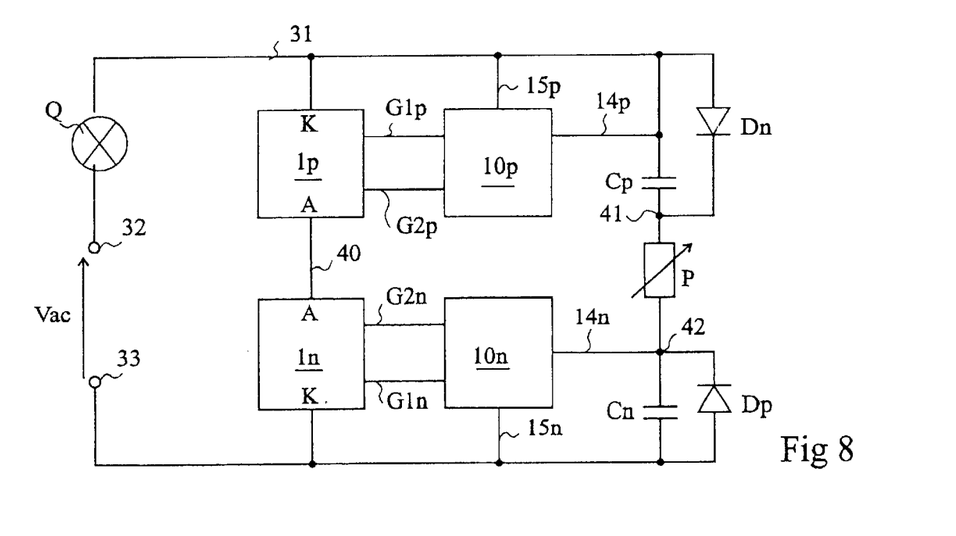
FIG. 8 schematically shows a third embodiment of a load control circuit implementing the present invention.

As previously indicated, two power switches such as illustrated in FIG. 1 will be used to operate one load on the positive and negative halfwaves of an A.C. power supply. According to whether these switches are connected in series in an assembly with common cathodes or common anodes, a single voltage pulse generator associated with a rectifying bridge will be used in the case of an assembly with common cathodes or two distinct voltage pulse generators will be used in the case of an assembly with common anodes. FIGS. 7 and 8 illustrate these two examples of application of the present invention.

FIG. 7 shows a second embodiment of a circuit for controlling a load Q by means of two switches 1p and 1n respectively associated with the positive and negative halfwaves of an A.C. voltage Vac (for example, the mains voltage). In FIG. 7, switches 1p and 1n are assembled with common cathodes, that is, the respective cathodes K of the two triacs (3, FIG. 1) of switches 1p and 1n are interconnected (node 30, FIG. 7). Anode A of a first switch (for example 1p) is connected to a first terminal 31 of load Q, the other terminal 32 of which is connected to a first terminal (for example, the phase terminal) of voltage source Vac. The other terminal 33 (for example, the neutral) of voltage source Vac is connected to anode A of second switch 1n. The control of switches 1p and 1n is performed by means of a single pulse generator 10 according to the present invention. Terminals 14 and 15 of this generator 10 receive a voltage rectified by means, for example, of a bridge 34 of diodes D1, D2, D3, and D4. The A.C. input terminals of bridge 34 (anode of diode D1 and cathode of diode D2—anode of diode D3 and cathode of diode D4) are respectively connected to terminals 31 and 33 while its rectified output terminals (cathodes of diodes D1, D3 and anodes of diodes D2, D4) are connected to terminals 14 and 15, the voltage reference (terminal 15) being further connected to node 30. Generator 10 provides, either directly or via a resistive and capacitive assembly (not shown and assumed to be contained in block 10 of FIG. 7) similar to that in FIG. 6, the control signals of gates G0 and G2 of switches 1p and 1n. In this embodiment, these gates are common to two switches, that is, a same signal is sent onto gates G1 of both switches 1p and 1n, and a same signal is sent onto gates G2 of both switches 1p and 1n. The power variation is here controlled by a potentiometer P, connected in series with a capacitor C, between terminals 14 and 15.

FIG. 8 shows a third embodiment of a circuit for controlling a load Q by means of two switches 1p and 1n respectively associated with the positive and negative halfwaves of an A.C. voltage Vac (for example, the mains voltage). In FIG. 8, switches 1p and 1n are assembled with common anodes, that is, the respective anodes A of the two triacs (3, FIG. 1) of switches 1p and 1n are interconnected (node 40, FIG. 8). Cathode K of a first switch (for example, 1p) is connected to a first terminal 31 of load Q, the other terminal 32 of which is connected to a first terminal of application (for example, the phase terminal) of voltage Vac. The other terminal 33 (for example, the neutral) of application of voltage Vac is connected to cathode K of second switch 1n. The control of switches 1p and 1n is performed by means of two pulse generators 10p and 10n, each dedicated to one of the switches. Generator 10p thus provides the control signals to gates G1p and G2p of switch 1p while generator 10n provides the control signals to gates G1n and G2n of switch 1n. The respective voltage references (terminals 15p and 15n) of generators 10p and 10n are separated and connected, respectively, to terminals 31 and 33. However, according to the present invention, a common control element (potentiometer P) is used to set the supply power of load Q. For this purpose, a first capacitor Cp is connected between terminal 31 and a first terminal 41 of potentiometer P. Capacitor Cp is intended for generator 10p, terminal 14p of which is connected to terminal 31. A second capacitor Cn, intended for generator 10n, is connected between the second terminal 42 of potentiometer P and terminal 33. Terminal 14n of generator 10n is then connected to terminal 42. To dedicate each capacitor to one of the generators, two diodes Dp and Dn are respectively assembled in parallel on these capacitors Cp and Cn, the anode of diode Dn being connected to terminal 31 and the anode of diode Dp being connected to terminal 33.

The operation of the assemblies of FIGS. 7 and 8 can be deduced from the above description of the preceding drawings. It should however be noted that the assembly of FIG. 7 is a preferred embodiment, since it requires a single capacitor C and a single generator 10.

In the example of FIGS. 7 and 8, the use of switches 10 of the embodiment of FIG. 3, that is, with no servo-control, has been considered. Generators 10' (FIG. 4) may however be used by connecting, in the assembly of FIG. 8, terminal 20 of the two generators to the common anode of switches 1p and 1n, and in the assembly of FIG. 7, terminal 20 of the common generator to each of the anodes of switches 1p and 1n via diodes to avoid a short-circuit between the two anodes.

Of course, the present invention is likely to have various alterations, modifications, and improvements which will readily occur to those skilled in the art. In particular, the sizing of the different components of the voltage pulse generator of the present invention is to be adapted according to the application and, especially, according to the desired triggering delays and on the desired pulse durations. Further, although the present invention has been more specifically described in relation with a preferred application to a power switch with a controlled di/dt, it should be noted that the voltage pulse generator of the present invention may have other applications. For example, such a generator may be used to control a MOS transistor across which an oscillating signal is desired to be recovered. In this case, the voltage generator of the present invention may even be supplied by a D.C. voltage source by being associated with a potentiometer (P) and with a capacitor (C) such as illustrated in FIGS. 3 and 4. The potentiometer then determines the frequency and the duty ratio. The rising time of the oscillating signal is determined by potentiometer P that conditions the charge time of capacitor C. The falling time of the oscillating circuit is determined at the first order by resistances R1 and R2 and at the second order by potentiometer P and the load. Adapting a voltage pulse generator according to the present invention to such an application is within the abilities of those skilled in the art based on the functional indications given hereabove. Further, it should be noted that although the use of a Shockley-diode type component and of an anode-gate thyristor is a preferred embodiment, other components with an equivalent function may be used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A analog voltage pulse generator, including:
    a first break-over component of Shockley diode type that when caused to be conductive activates a rising edge of a pulse on an output terminal; and
    a second component of thyristor type that when caused to be conductive deactivates the pulse at the end of a predetermined time period after the activation of the rising edge.

2. The pulse generator of claim 1, including an RC cell between an input terminal and said first component to preset the time of occurrence of a rising edge of a pulse.

3. The pulse generator of claim 1, including a first resistor between said first component and said generator output terminal.

4. The generator of claim 1, including a second resistor connected across an input and an output of the second component.

5. The generator of claim 1, wherein the first component is for me d of a first element of thyristor type associated with a second element of Zener diode type between its gate and its anode.

6. The pulse generator of claim 1, wherein th e second component is a cathode-gate thyristor, the anode of which is connected to the cathode of the first component and the gate of which is connected, via a Zener diode, to a terminal of a capacitor adapted to being charged when the first component is on.

7. The pulse generator of claim 1 having the output terminal connected to a MOS or IGBT-type component, wherein the second component is an anode-gate thyristor connected to the MOS or IGBT-type component.

8. The pulse generator of claim 7, wherein an anode gate of the anode-gate thyristor is connected to a measurement terminal of the MOS or IGBT-type component.

9. The pulse generator of claim 8, wherein a diode is interposed between the anode gate of the second component and the measurement terminal, a Zener diode being interposed between the anode gate of the second thyristor-type component and the measurement terminal.

10. A circuit for controlling a load adapted to being supplied by a high A.C. voltage including:
at least one power switch with a controlled di/dt including the parallel assembly of a MOS or IGBT-type component and of a thyristor-type component, with means for inhibiting the thyristor-type component during the turn-on phase of the switch, which is ensured by the IGBT-type component; and
at least one voltage pulse generator according to claim 1 for controlling, with pulses, the turning-on of the IGBT-type component.

11. The circuit of claim 10, wherein the means for inhibiting the component of thyristor type of the power switch is formed of a MOS-type transistor, the gate of which is also controlled with pulses, by means of said voltage pulse generator.

12. The circuit of claim 11, including two power switches, connected in series-opposition with each other and in series with the load to be controlled, each switch being associated with a sign of halfwaves of the A.C. voltage and being controlled by a pulse generator, the time of occurrence of a rising edge of a pulse with respect to the beginning of a halfwave of the A.C. voltage being set by means of a resistive element common to both generators and assembled in series with two storage capacitors respectively dedicated to one of the generators.

13. The circuit of claim 11, including two power switches, assembled in series-opposition with each other and in series with the load to be supplied, each switch being associated with a sign of halfwaves of the A.C. voltage and the two switches being controlled by a same pulse generator associated with a rectifying means, the time of occurrence of a rising edge of a pulse with respect to the beginning of a halfwave of the A.C. voltage being set by means of a resistive element in series with a storage capacitor.

14. A circuit for controlling a load adapted to being supplied by a high A.C. voltage including:
a first and a second power switch with a controlled di/dt including the parallel assembly of a MOS or IGBT-type component and of a thyristor-type component inhibited during a turn-on phase of the switch by a MOS-type transistor, the turn-on phase being ensured by the IGBT-type component, the first and second power switches connected in series-opposition with each other and in series with the load to be controlled, each switch being associated with a sign of halfwaves of the A.C. voltage;
a first and a second voltage pulse generator for controlling, with pulses, the turning-on of the IGBT-type component of the first and second power switches, respectively, each voltage pulse generator comprising:
a first break-over component of Shockley diode type to activate a rising edge of a pulse on an output terminal; and
a second component of thyristor type to deactivate the pulse at the end of a predetermined time period after the activation of the rising edge,
wherein the output terminals of the first and second pulse generators are connected to the IGBT-type component of the first and second switches, respectively, and connected to a gate of the MOS-type transistor, and wherein a time of occurrence of a rising edge of a pulse with respect to the beginning of a halfwave of the A.C. voltage is set by means of a resistive element common to the first and second pulse generators and assembled in series with two storage capacitors respectively dedicated to one of the first and second pulse generators.

15. A circuit for controlling a load adapted to being supplied by a high A.C. voltage including:
a first and a second power switch with a controlled di/dt including the parallel assembly of a MOS or IGBT-type component and of a thyristor-type component inhibited during a turn-on phase of the switch by a MOS-type transistor, the turn-on phase being ensured by the IGBT-type component, the first and second power switches connected in series-opposition with each other and in series with the load to be controlled, each switch being associated with a sign of halfwaves of the A.C. voltage;
a voltage pulse generator for controlling, with pulses, the turning-on of the IGBT-type component of the first and second power switches, the voltage pulse generator comprising:
a first break-over component of Shockley diode type to activate a rising edge of a pulse on an output terminal; and
a second component of thyristor type to deactivate the pulse at the end of a predetermined time period after the activation of the rising edge,
wherein the pulse generator is associated with a rectifying means and the output terminal of the pulse generator is connected to the IGBT-type component of the first and second switches and connected to a gate of the MOS-type transistor, and wherein a time of occurrence of a rising edge of a pulse with respect to the beginning of a halfwave of the A.C. voltage is set by means of a resistive element in series with a storage capacitor.

16. An analog voltage pulse generator to provide a pulse on an output terminal, the pulse generator comprising:
a first component including a thyristor adapted to provide a leading edge of the pulse when caused to be conductive; and
a second component including a thyristor adapted to provide a trailing edge of the pulse when caused to be conductive,
wherein the first component comprises:
a first cathode-gate thyristor; and
a first Zener diode having a first terminal connected to an anode of the first cathode-gate thyristor and a second terminal connected to a cathode gate of the first cathode-gate thyristor.

17. The pulse generator of claim 16, further comprising an A.C. input voltage supply coupled to a first terminal of the first component.

18. The pulse generator of claim 17, further comprising a first RC circuit having a first terminal connected between the A.C. voltage supply and the first terminal of the break-over component, the first RC circuit adapted to provide a delay between a beginning of a half-wave of the A.C. voltage supply and the leading edge of the pulse.

19. The pulse generator of claim 18, wherein the first RC circuit is adapted to provide the delay between the beginning of a positive half-wave of the A.C. voltage supply and the leading edge, and wherein the leading edge of the pulse is a rising edge and the trailing edge of the pulse is a falling edge.

20. The pulse generator of claim 18, wherein the first RC circuit is adapted to provide a delay between the beginning of a negative half-wave of the A.C. voltage supply and the leading edge, and wherein the leading edge of the pulse is a falling edge and the trailing edge of the pulse is a rising edge.

21. The pulse generator of claim 17, wherein the first break-over component is adapted to electrically connect the A.C. voltage supply to the output terminal when caused to be conductive.

22. The pulse generator of claim 21, wherein the second component is adapted to electrically connect the A.C. voltage supply to a reference voltage when caused to be conductive.

23. The pulse generator of claim 16, further comprising a second RC circuit having a first terminal connected between a second terminal of the first break-over component and a first terminal of the second component, the second RC circuit adapted to provide a delay between the leading edge and the trailing edge of the pulse.

24. The pulse generator of claim 16, wherein the first terminal of the Zener diode is a cathode and the second terminal is an anode of the Zener diode.

25. The pulse generator of claim 24, wherein the second component comprises:
a second cathode-gate thyristor; and
a second Zener diode having a first terminal connected to a cathode gate of the second cathode-gate thyristor.

26. The pulse generator of claim 25, wherein the first terminal of the second Zener diode is an anode of the second Zener diode.

27. The pulse generator of claim 24, wherein a cathode of the first cathodegate thyristor is connected to an anode of the second cathode-gate thyristor.

28. The pulse generator of claim 24, further comprising:
a first resistor having a first terminal connected to a first potential and a second terminal connected to the anode of the first cathode-gate thyristor; and
a first capacitor having a first terminal connected to the anode of the first cathode-gate thyristor and a second terminal connected to a reference potential.

29. The pulse generator of claim 28, wherein the first component is caused to be conductive when the voltage across the first capacitor exceeds a break-down voltage of the first Zener diode.

30. The pulse generator of claim 29, wherein the first potential is an A.C. voltage supply, and wherein the first resistor and the first capacitor form a first RC circuit adapted to provide a delay between a beginning of a half-wave of the A.C. voltage supply and the leading edge of the pulse.

31. The pulse generator of claim 25, further comprising:
a second resistor having a first terminal connected to a cathode of the first cathode-gate thyristor and a second terminal connected to a cathode of the second Zener diode; and a second capacitor having a first terminal connected to the cathode of the second Zener diode and a second terminal connected to a reference potential.

32. The pulse generator of claim 31, wherein the second component is caused to be conductive when a voltage across the second capacitor exceeds a break-down voltage of the second Zener diode.

33. The pulse generator of claim 32, wherein the second resistor and the second capacitor form a second RC circuit adapted to provide a delay between the leading edge and the trailing edge of the pulse.

34. An analog voltage pulse generator to provide a pulse on an output terminal, the pulse generator comprising:
a first component including a thyristor adapted to provide a leading edge of the pulse when caused to be conductive;
a second component including a thyristor adapted to provide a trailing edge of the pulse when caused to be conductive;
further comprising an external component connected to the output terminal;
wherein the external component causes the second component to be conductive depending on at least one of a current through a first portion of the external component, and a voltage across a second portion of the external component; and
wherein the second component comprises an anode-gate thyristor.

35. The pulse generator of claim 34, wherein a first terminal of the external component is connected to an anode of the anode-gate thyristor.

36. The pulse generator of claim 35, wherein a second terminal of the external component is coupled to an anode gate of the anode-gate thyristor.

37. The pulse generator of claim 36, further comprising a first and a second diode interposed between the anode gate of the anode-gate thyristor and the second terminal of the external component.

38. The pulse generator of claim 37, wherein the first diode is a Zener diode having a cathode connected to the anode gate of the anode-gate thyristor and an anode connected to an anode of the second diode, and wherein a cathode of the second diode is connected to the second terminal of the external component.

39. The pulse generator of claim 38, wherein the second component is caused to be conductive when a voltage at the second terminal of the external component exceeds the break-down voltage of the second diode.

40. The pulse generator of claim 39, wherein th e external component comprises a MOS or IGBT-type component, and wherein the first terminal is a gate of the MOS or IGBT-type component and the second terminal is a collector of the MOS or IGBT-type component.

* * * * *